(12) United States Patent
Choi et al.

(10) Patent No.: US 8,564,194 B2
(45) Date of Patent: Oct. 22, 2013

(54) ORGANIC LIGHT EMITTING DIODE DEVICE AND METHOD FOR FABRICATING THE SAME

(75) Inventors: Hee-Dong Choi, Gyeongsangbuk-Do (KR); Jae-Hee Park, Daegu (KR)

(73) Assignee: LG Display Co., Ltd., Seoul (KR)

( * ) Notice: Subject to any disclaimer, the term of this patent is extended or adjusted under 35 U.S.C. 154(b) by 1551 days.

(21) Appl. No.: 11/640,398

(22) Filed: Dec. 18, 2006

(65) Prior Publication Data

US 2007/0152574 A1 Jul. 5, 2007

(30) Foreign Application Priority Data

Dec. 31, 2005 (KR) .......................... 10-2005-136343

(51) Int. Cl.
*H01J 9/24* (2006.01)
*H01J 1/62* (2006.01)
*H01J 63/04* (2006.01)

(52) U.S. Cl.
USPC ............................................ 313/506; 455/24

(58) Field of Classification Search
USPC ........................... 313/498–512; 428/690–691
See application file for complete search history.

(56) References Cited

U.S. PATENT DOCUMENTS

2006/0044232 A1* 3/2006 Choi et al. ....................... 345/76
2006/0145160 A1* 7/2006 Park et al. ....................... 257/72

* cited by examiner

*Primary Examiner* — Anh Mai
*Assistant Examiner* — Zachary J Snyder
(74) *Attorney, Agent, or Firm* — Birch, Stewart, Kolasch & Birch, LLP

(57) ABSTRACT

An organic light emitting diode device includes a gate electrode of a first transistor on a substrate; a gate insulation film on the gate electrode of the first transistor; a source electrode of a second transistor on the gate insulation film and overlapping with the gate electrode of the first transistor; a contact hole exposing the gate electrode of the first transistor and the source electrode of the second transistor; a conductive wiring in the contact hole, for electrically connecting the gate electrode of the first transistor and the source electrode of the second transistor.

20 Claims, 7 Drawing Sheets

US 8,564,194 B2

ORGANIC LIGHT EMITTING DIODE DEVICE AND METHOD FOR FABRICATING THE SAME

CROSS-REFERENCE TO RELATED APPLICATION

This Nonprovisional Application claims priority under 35 U.S.C. §119(a) on Patent Application No. 10-2005-0136343 filed in Korea on Dec. 31, 2005, the entire contents of which are hereby incorporated by reference.

BACKGROUND OF THE INVENTION

1. Field of the Invention

The present invention relates to an organic light emitting diode device and a method for fabricating the same, and more particularly, to an organic light emitting diode device which can obtain a sufficient margin and expand a design area of a driving transistor, by reducing the number of contact holes to minimize the area occupied by the contact holes, and a method for fabricating the same.

2. Description of the Background Art

A liquid crystal display with the features of light weight and low power consumption has been generally used as a flat panel display (FPD). However, the liquid crystal display is not a self light emitting device but requires backlight as an external light source. In addition, the liquid crystal display has technical limits in its brightness, contrast, viewing angle and size. Efforts have been actively made to develop a new FPD solving the aforementioned problems.

An organic light emitting diode device which is one of the new FPDs is a self light emitting device. Compared with the liquid crystal display, the organic light emitting diode device has an excellent viewing angle and high contrast, and the weight, thickness and power consumption of the organic light emitting diode device can be reduced by omitting a backlight.

The organic light emitting diode device attains low DC voltage driving and fast response speed. In addition, the organic light emitting diode device is made of a solid material to resist an external shock, has a wide temperature range, and cuts down the fabrication cost.

Especially, unlike a liquid crystal display or a plasma display panel (PDP), the organic electroluminescent device requires only deposition and encapsulation equipment in fabrication. Therefore, a fabrication process thereof is considerably simplified.

On the other hand, a passive matrix method without using a special thin film transistor (TFT) has been generally used as a driving method of the organic light emitting diode device.

In the passive matrix method, scan lines and signal lines cross each other to form a device in a matrix manner. The passive matrix method sequentially drives the scan lines by time to drive each pixel. Accordingly, instantaneous brightness equivalent to average brightness multiplied by a line number is necessary to acquire target average brightness.

In the passive matrix method, when the number of the lines increases, a higher voltage and current must be instantaneously applied, which accelerates deterioration of the device and increases the power consumption of the device. As a result, the passive matrix method is not suitable for a high definition large-size display.

In an active matrix method, a TFT for turning on and off a pixel is disposed at each pixel and operated as a switch. A first electrode is turned on/off in pixel units, and a second electrode facing the first electrode is used as a common electrode.

In addition, in the active matrix method, a voltage applied to the pixels is charged in a storage capacitor, for applying power until the application of a succeeding frame signal. Therefore, the driving state can be continuously maintained for one frame, regardless of a number of scan lines.

The active matrix method generates the same brightness even at a low current, and thus attains low power consumption and high precision and is suitable for a large-size display. The basic structure of the active matrix organic light emitting diode device will now be explained.

Although not illustrated, gate lines are formed on a substrate (not shown) in a first direction, and a data line and a power supply line are formed in a second direction crossing the first direction and isolated from each other at a predetermined interval, for defining one pixel area.

A switching TFT which is an addressing element is formed at the crossing point of the gate line and the data line. A storage capacitor is connected to the switching TFT and the power supply line. A driving TFT which is a current source element is connected to the storage capacitor and the power supply line. An organic electroluminescent diode is connected to the driving TFT.

In the organic light emitting diode device, when a current is supplied to an organic light emitting material in the forward direction, electrons and holes move to be recombined through a P-N junction between an anode electrode which is a hole supply layer and a cathode electrode which is an electron supply layer, and have smaller energy after the recombination than the separated electrons and holes. The organic light emitting diode device uses a principle of emitting light by the energy released during the recombination of the electrons and holes. The switching TFT serves to control the voltage and store the current source.

FIG. 1 is a layout view illustrating an interconnection structure between at least two transistors g in one pixel of the organic light emitting diode device described above. Referring to FIG. 1, a gate electrode 13 of a second TFT which is a driving transistor is isolated from a source electrode 17 of a first TFT which is a switching transistor at a predetermined interval.

A connection wiring 27 for connecting the gate electrode 13 of the second TFT to the source electrode 17 of the first TFT through first and second contact holes 23 and 25 is disposed on the gate electrode 13 of the second TFT and the source electrode 17 of the first TFT.

The method for interconnecting the two transistors will now be explained with reference to FIGS. 2A to 2F. FIGS. 2A to 2F are schematic cross-sectional views illustrating a contact process between the drain/source and the gate, taken along line II-II of FIG. 1.

Referring to FIG. 2A, the gate electrode 13 of the driving transistor is formed by depositing a conductive material layer on an insulation substrate 11, and selectively patterning the conductive material layer by a light exposure and development process using a light exposure mask. When the gate electrode 13 of the driving transistor is formed, a gate electrode (not shown) of the switching transistor is also formed.

As illustrated in FIG. 2B, a gate insulation film 15 is deposited on the whole substrate 11 including the gate electrode 13. An active layer (not shown) and an ohmic contact layer (not shown) are sequentially laminated on the gate insulation film 15. A conductive material such as Mo is deposited on the whole substrate 11. The source/drain electrodes 17 of the first TFT which is the switching transistor are formed by selectively patterning the conductive material layer by a light exposure and development process using a light exposure mask. When the source/drain electrodes 17 of the first TFT are formed, the source/drain electrodes (not shown) of the driving TFT are also formed.

As shown in FIG. 2C, a protection film 19 is formed on the gate insulation film 15 including the source electrode 17 of the first TFT. As depicted in FIG. 2D, a photoresist film pattern 21 is formed to expose the protection film 19 on the source electrode 17 and the gate electrode 13 of the second TFT, by coating a photoresist film (not shown) on the protection film 19, and selectively removing the photoresist film by a light exposure and development process using a light exposure mask.

As illustrated in FIG. 2E, the first contact hole 23 and the second contact hole 25 are formed by selectively removing the protection film 19, the gate insulation film 15 and the source electrode 17 using the photoresist film pattern 21 as a mask. When the first contact hole 23 is formed, the source electrode 17 is etched to expose the gate insulation film 15 disposed below. When the second contact hole 25 is formed, the etching process is carried out to expose the top surface of the gate electrode 13.

Referring to FIG. 2F, the connection wiring 27 for electrically connecting the source electrode 17 of the first TFT to the gate electrode 13 of the second TFT is formed by removing the photoresist film pattern 21, depositing a conductive material layer on the whole substrate 11 including the first and second contact holes 23 and 25, and selectively patterning the conductive material layer.

The conventional organic light emitting diode device has the following disadvantages. In the related art active matrix organic light emitting diode device, especially, based on amorphous silicon, two or more transistors exist in one pixel, and the contact holes are formed to interconnect the transistors or the layers. In the case of a small-sized device, the pixel size is relatively small, and thus the area occupied by the transistors is limited in the pixel. Therefore, a current stress applied to the driving transistor increases. Accordingly, the lifespan of the transistor is shortened. That is, when the design area of the driving transistor is reduced, the lifespan of the transistor is relatively shortened. As a result, the lifespan of the organic electroluminescent device is shortened.

SUMMARY OF THE INVENTION

Therefore, an object of the present invention is to provide an organic light emitting diode device which can obtain a sufficient margin and expand a design area of a driving transistor, by reducing the number of the contact holes to minimize the area occupied by the contact holes, and a method for fabricating the same.

To achieve these and other advantages and in accordance with the purpose of the present invention, as embodied and broadly described herein, there is provided an organic light emitting diode device, including: a gate electrode of a first transistor on a substrate; a gate insulation film on the gate electrode of the first transistor; a source electrode of a second transistor on the gate insulation film and overlapping with the gate electrode of the first transistor; a contact hole exposing the gate electrode of the first transistor and the source electrode of the second transistor; and a conductive wiring in the contact hole, for electrically connecting the gate electrode of the first transistor and the source electrode of the second transistor.

According to another aspect of the present invention, there is provided an organic light emitting diode device, including: a gate wiring, a gate electrode of a first transistor and a capacitor lower electrode formed on a substrate; a gate insulation film, a semiconductor layer, source and drain electrodes of a second transistor, a data wiring and a capacitor upper electrode formed above the substrate and the gate electrode; an interlayer insulation film formed on the whole substrate, and having a plurality of contact holes for exposing the gate electrode of the first transistor, the source and drain electrodes of the second transistor, the capacitor lower electrode and the capacitor upper electrode; a plurality of conductive wirings formed on the interlayer insulation film, and respectively connected to the gate electrode of the first transistor, the source and drain electrodes of the second transistor, the lower electrode and the upper electrode through the plurality of contact holes, one of the contact holes exposing the gate electrode of the first transistor and one of the source and drain electrodes of the second transistor, one of the conductive wirings being located in the one of the contact holes to electrically connect the gate electrode of the first transistor and the source electrode of the second transistor; and an organic light emitting diode element formed on the interlayer insulation film, and connected to the connection wirings.

According to yet another aspect of the present invention, there is provided a method for fabricating an organic light emitting diode device, including: forming a gate electrode of a first transistor on a substrate; forming a gate insulation film on the gate electrode of the first transistor; forming a source electrode of a second transistor on the gate insulation film such that the source electrode of the second transistor are overlapped with the gate electrode of the first transistor; forming a contact hole exposing the gate electrode of the first transistor and the source electrode of the second transistor; and forming a conductive wiring in the contact hole such that the conductive wiring electrically connects the gate electrode of the first transistor and the source electrode of the second transistor.

According to yet another aspect of the present invention, there is provided a method for fabricating an organic light emitting diode device, including: forming a gate wiring, a gate electrode of a first transistor and a capacitor lower electrode on a substrate; forming a gate insulation film, a semiconductor layer, source and drain electrodes of a second transistor, a data wiring and a capacitor upper electrode above the substrate and the gate electrode; forming an interlayer insulation film on the whole substrate to have a plurality of contact holes for exposing the gate electrode of the first transistor, the source and drain electrodes of the second transistor, the capacitor lower electrode and the capacitor upper electrode; forming a plurality of conductive wirings on the interlayer insulation film to be respectively connected to the gate electrode of the first transistor, the source and drain electrodes of the second transistor, the lower electrode and the upper electrode through the plurality of contact holes, one of the contact holes being formed to expose the gate electrode of the first transistor and one of the source and drain electrodes of the second transistor, one of the conductive wirings being formed to be located in the one of the contact holes to electrically connect the gate electrode of the first transistor and the source electrode of the second transistor; and forming an organic light emitting diode element on the interlayer insulation film to be connected to the connection wirings.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to the preferred embodiments of the present invention, examples of which are illustrated in the accompanying drawings.

Figure 1:
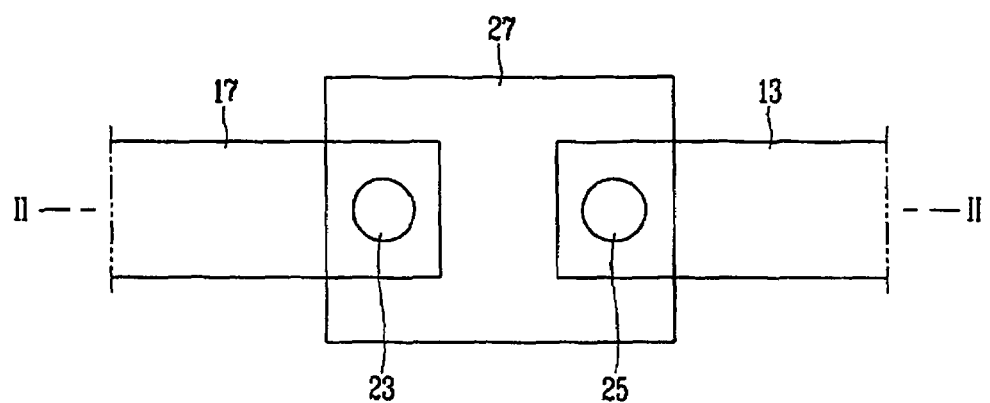
FIG. 1 is an enlarged plane view illustrating an interconnection structure between a source electrode of a first transistor unit and a gate electrode of a second transistor unit in a general active matrix organic light emitting diode device.
Figure 2A:
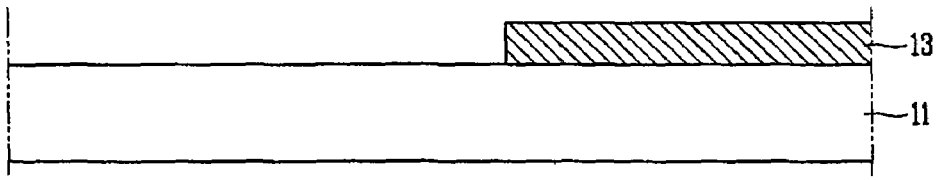
FIGS. 2A to 2F are schematic cross-sectional views illustrating a contact process between the drain/source and the gate, taken along line II-II of FIG. 1.
Figure 2B:
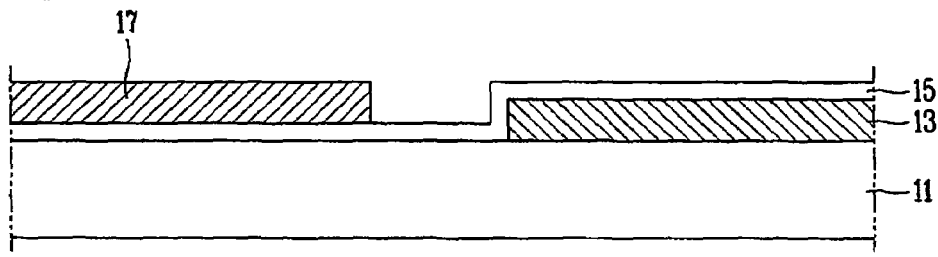
Figure 2C:
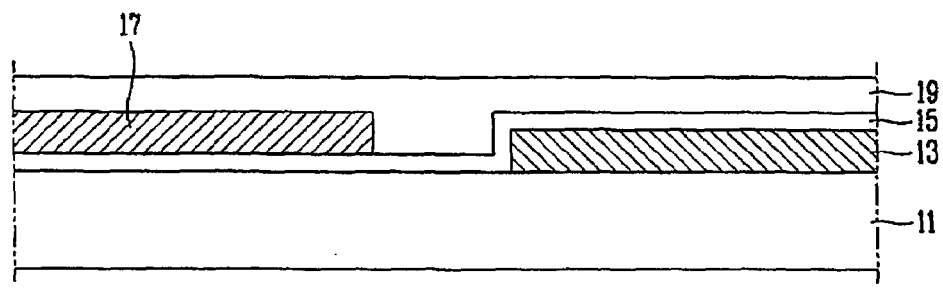
Figure 2D:
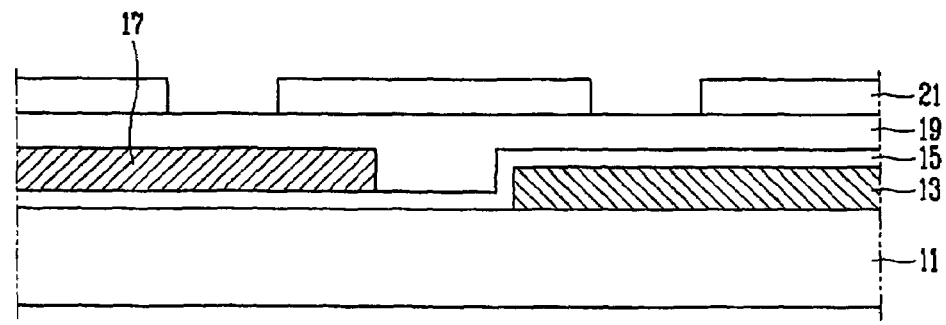
Figure 2E:
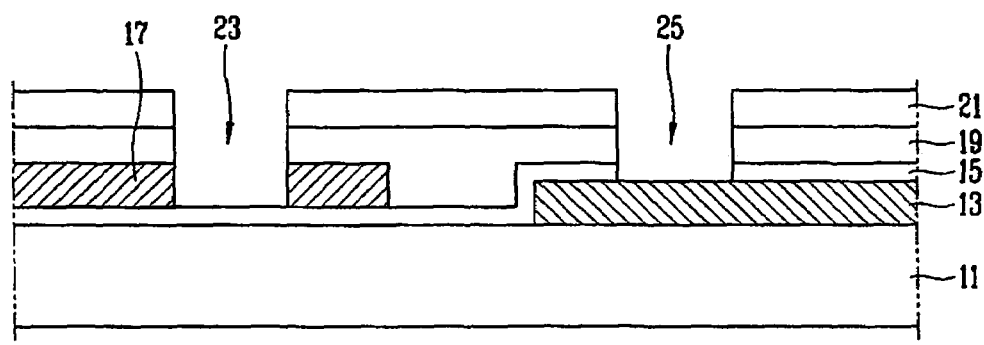
Figure 2F:
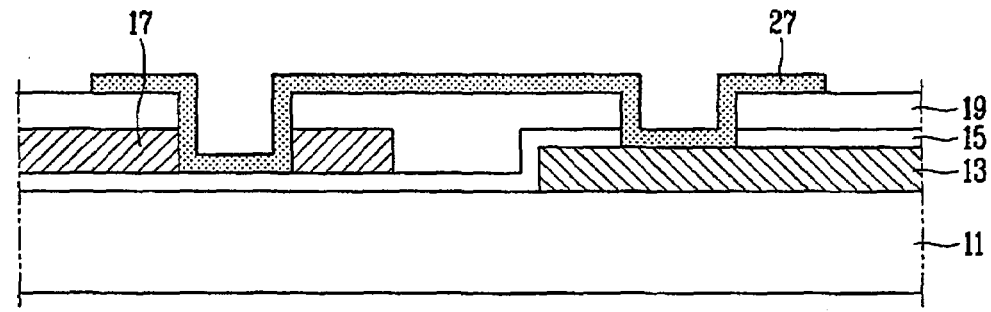
Figure 3:
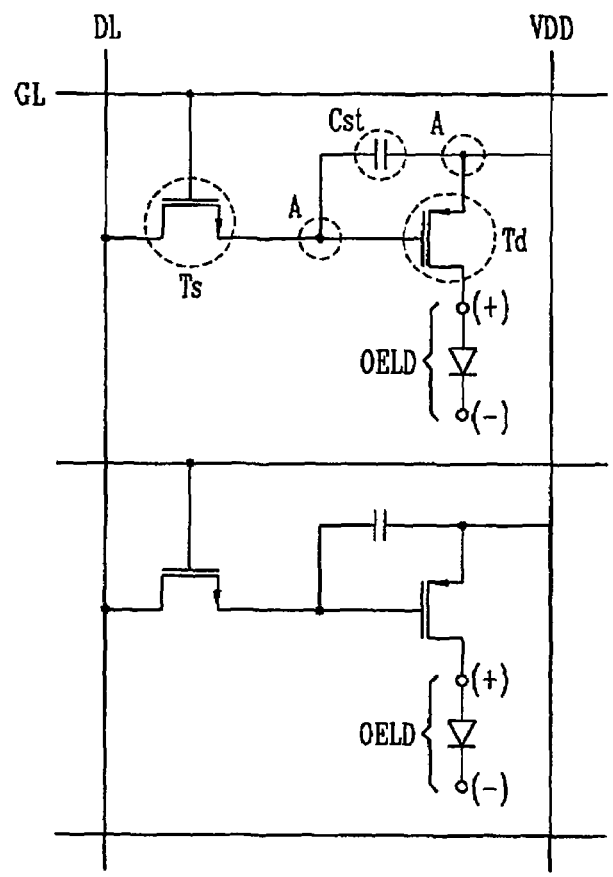
FIG. 3 is a circuit illustrating a basic structure of a pixel in an active matrix organic light emitting diode device in accordance with an embodiment of the present invention.
Figure 4:
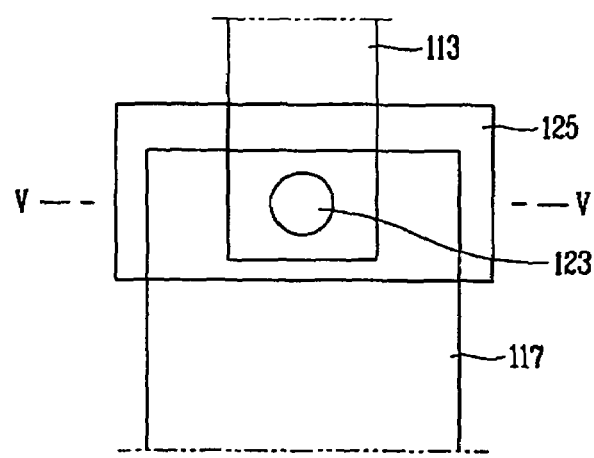
FIG. 4 is an enlarged layout view illustrating part A of FIG. 3.

FIG. 3 is a circuit illustrating a basic structure of a pixel in an active matrix organic light emitting diode device in accordance with an embodiment of the present invention. FIG. 4 is an enlarged layout view illustrating part A of FIG. 3 in the active matrix organic light emitting diode device in accordance with an embodiment of the present invention.

Referring to FIG. 3, gate lines GL are formed on a substrate (not shown) in a first direction, and a data line DL and a power supply line VDD are formed in a second direction crossing the first direction and isolated from each other at a predetermined interval, for defining one pixel area. A switching TFT Ts which is an addressing element is formed at the crossing point of the gate line GL and the data line DL. A storage capacitor Cst is connected to the switching TFT Ts and the power supply line VDD. A driving TFT Td which is a current source element is connected to the storage capacitor Cst and the power supply line VDD. An organic electroluminescent diode OELD is connected to the driving TFT Td.

In the organic light emitting diode device (OLED), when a current is supplied to an organic light emitting material in the forward direction, electrons and holes move to be recombined through a P-N junction between an anode electrode which is a hole supply layer and a cathode electrode which is an electron supply layer, and have smaller energy after the recombination than the separated electrons and holes. The organic light emitting diode OLED uses a principle of emitting light by the energy released during the recombination of the electrons and holes. The switching TFT Ts serves to control the voltage and store the current source.

On the other hand, FIG. 4 is a layout view illustrating an interconnection structure between at least two transistors in one pixel of the organic light emitting diode device in accordance with an embodiment of the present invention. As illustrated in FIG. 4, a gate electrode 113 of a second TFT which is a driving transistor and a source electrode 117 of a first TFT which is a switching transistor are disposed to overlap with each other by a predetermined length.

A connection wiring 125 for electrically connecting the gate electrode 113 of the second TFT to the source electrode 117 of the first TFT through a contact hole 123 is disposed on the gate electrode 113 of the second TFT and the source electrode 117 of the first TFT. The interconnection structure between the TFTs in the organic light emitting diode device and the fabrication method thereof will now be described with reference to the accompanying drawings.

FIGS. 5A to 5E are schematic cross-sectional views illustrating a contact process between the drain/source and the gate, taken along line V-V of FIG. 4. The first switching transistor and the second driving transistor have the same structure. The structure of the first switching transistor will now be explained.

Figure 5A:
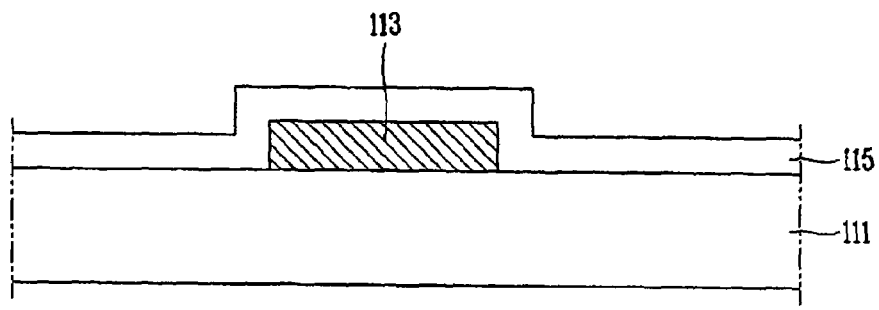
FIGS. 5A to 5E are schematic cross-sectional views illustrating a contact process between a drain/source and a gate, taken along line V-V of FIG. 4.

Referring to FIG. 5A, the gate electrodes 113 of the driving transistor and the switching transistor are formed by depositing a conductive material layer on an insulation substrate 111, and selectively patterning the conductive material layer by a light exposure and development process using a light exposure mask. When the gate electrode 113 is formed, a gate wiring (not shown) and a capacitor lower electrode 113a (referring to FIG. 6) are also formed. Subsequently, a gate insulation film 115 is deposited on the whole substrate 111 including the gate electrode 113.

Figure 5B:
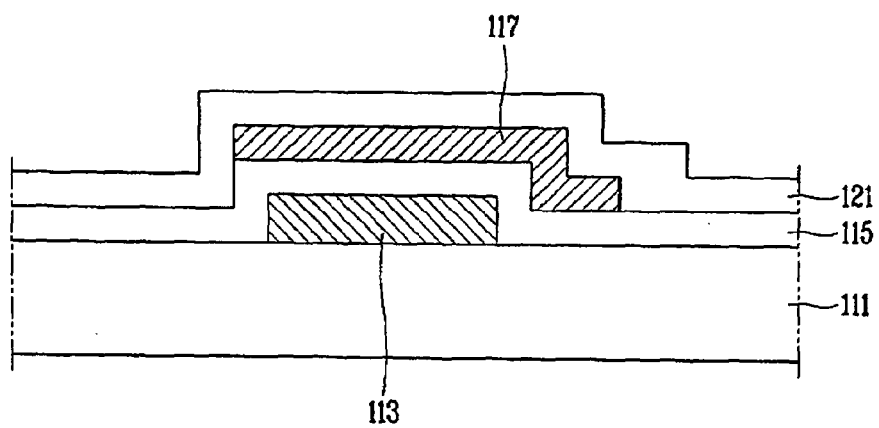

As illustrated in FIG. 5B, an active layer (not shown) and an ohmic contact layer (not shown) are sequentially laminated on the gate insulation film 115, and a conductive material such as Mo is deposited on the whole substrate 111. A drain electrode 117a and a source electrode 117b of the first TFT which is the switching transistor are formed by selectively patterning the conductive material layer by a light exposure and development process using a light exposure mask. When the drain electrode 117a and the source electrode 117b are formed, a capacitor upper electrode 117c (referring to FIG. 6) is also formed. Hereinafter, the drain electrode 117a and the source electrode 117b are referred to as the source/drain electrodes 117 in FIGS. 5B-5E. When the source/drain electrodes 117 of the first TFT are formed, the source/drain electrodes (not shown) of the driving TFT are also formed. The source/drain electrodes 117 partially overlap with the gate electrode 113 of the second TFT.

Figure 5C:
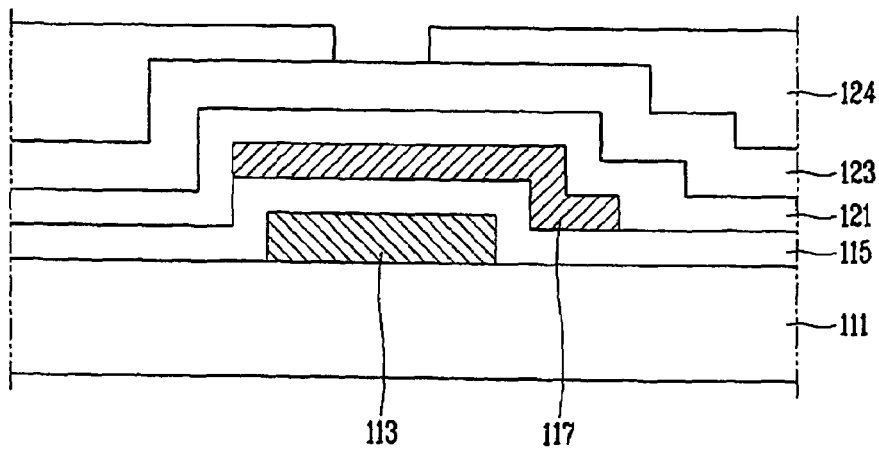

As shown in FIG. 5C, a first interlayer insulation film 121 is formed on the gate insulation film 115 and the source/drain electrodes 117 of the first TFT. A conductive material such as metal is deposited on the first interlayer insulation film 121. Although not illustrated in FIGS. 5A-5E (see FIG. 6), a cathode electrode 122 (pixel electrode) of an organic light emitting element is formed by selectively patterning the conductive material layer by using a mask pattern (not shown). A second interlayer insulation film 123 is deposited on the first interlayer insulation film 121 and the cathode electrode 122. A photoresist film (not shown) is coated on the second interlayer insulation film 123. A photoresist film pattern 124 is formed to expose the second interlayer insulation film 123 on the source electrode 117 and the gate electrode 113 of the second TFT, by selectively removing the photoresist film by a light exposure and development process using a light exposure mask.

Figure 5D:
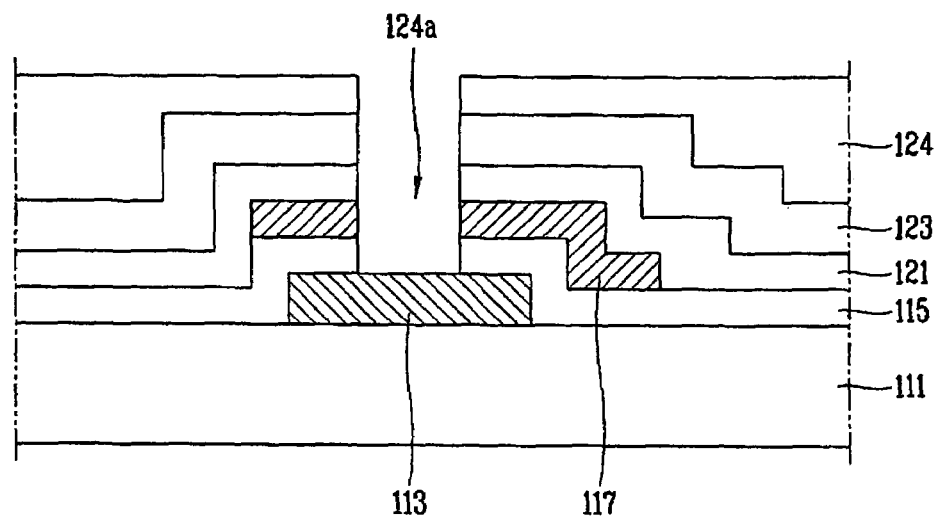

As illustrated in FIG. 5D, a contact hole 124a exposing the top surface of the gate electrode 113 of the second TFT is formed by sequentially removing the second interlayer insulation film 123, the first interlayer insulation film 121, the source electrode 117 and the gate insulation film 115 using the photoresist film pattern 121 as a mask.

Figure 5E:
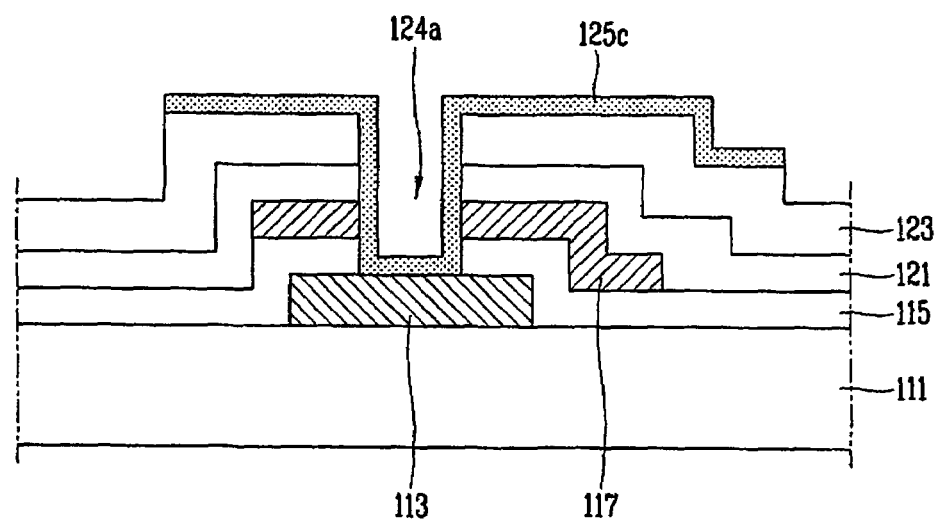
Figure 6:
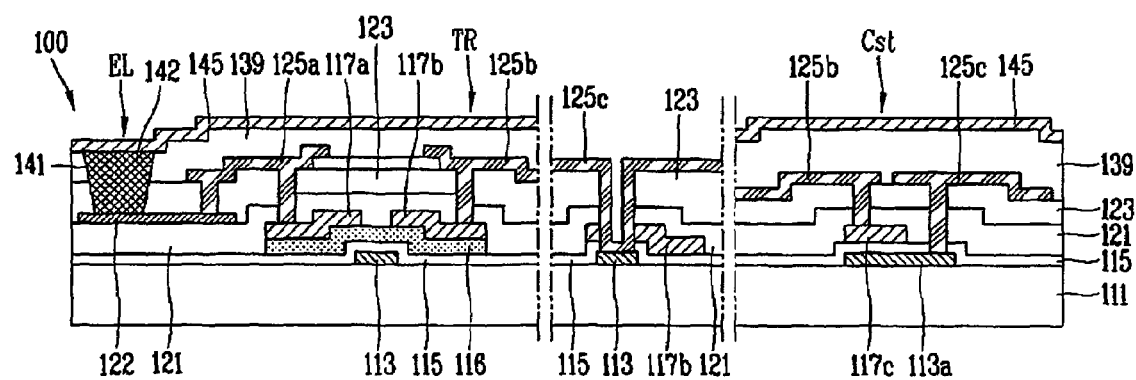
FIG. 6 is a cross-sectional view illustrating a method for fabricating the active matrix organic light emitting diode device in accordance with an embodiment of the present invention.

Referring to FIG. 5E, the photoresist film pattern 124 is removed, and a conductive material layer is deposited on the whole substrate 111 including the contact hole 123. A connection wiring 125a for electrically connecting the source electrode 117 of the first TFT to the gate electrode 113 of the second TFT is formed by selectively patterning the conductive material layer. When the connection wiring 125a is formed, a connection wiring 125b is formed to connect the drain electrode 117a to the cathode electrode 122, and a connection wiring 125c is formed to connect the capacitor lower electrode 113a to the power supply line VDD, as shown in FIG. 6. The connection wiring 125a contacts the exposed lateral surface of the source electrode 117 of the first TFT, and contacts the top surface of the gate electrode 113 of the second TFT.

On the other hand, a method for fabricating an active matrix organic light emitting diode device in accordance with an embodiment of the present invention will now be described with reference to FIG. 6. FIG. 6 is a cross-sectional view provided to explain the method for fabricating the active matrix organic light emitting diode device in accordance with an embodiment of the present invention.

As illustrated in FIG. 6, a gate wiring (not shown) and a gate electrode 113 (of the first TFT and the second TFT, i.e., of the switching TFT and the driving TFT) extending from the gate wiring are formed by depositing a gate electrode material on a substrate 111, and selectively removing the gate electrode material by a mask process. When the gate electrode 113 is formed, a lower electrode 113a of a capacitor (not shown) is also formed.

A semiconductor layer pattern 116 is formed by depositing a gate insulation film 115 and a semiconductor layer 116 on the whole substrate 111 including the gate electrode 113, and selectively patterning the resulting structure.

A drain electrode 117a and a source electrode 117b of the switching TFT are formed by depositing a conductive layer on the whole substrate 111 including the semiconductor layer pattern 116, and patterning the conductive layer. When the drain electrode 117a and the source electrode 117b are formed, a data wiring (not shown) crossing the gate wiring and an upper electrode 117c of the capacitor are also formed. A first interlayer insulation film 121 is deposited on the whole substrate 111, and a conductive material such as metal is deposited thereon.

A cathode electrode 122 (the pixel electrode) of an organic light emitting element is formed by selectively patterning the conductive material layer by using a mask pattern (not shown). A second interlayer insulation film 123 is formed on the whole substrate 111 including the cathode electrode 122 and the capacitor upper electrode 117c. A contact hole 124a (referring to FIG. 5D) is formed to expose the source/drain electrodes 117a/117b, the capacitor upper and lower electrodes 117c and 113 and part of the gate electrode 113, by selectively patterning the second interlayer insulation film 123, the first interlayer insulation film 121 and the source electrode 117 by using a mask pattern 124 (referring to FIG. 5D). A conductive material such as metal is deposited on the whole substrate 111 including the contact hole 124a.

A first connection wiring 125a for connecting the drain electrode 117a to the organic light emitting element, a second connection wiring 125b for connecting the source electrode 117b, the cathode upper electrode 117c and the power line VDD, and a third connection wiring 125c for connecting the capacitor lower electrode 113a, the source electrode 117b of the first TFT and the gate electrode of the second TFT through the first to fifth contact holes (not shown) are formed by selectively patterning the conductive material layer by using a mask pattern (not shown).

Thereafter, a third interlayer insulation film 139 is deposited on the whole substrate 111 by using an insulation material such as an oxide film. An opening 141 for exposing the cathode electrode 122 is formed by selectively patterning the third interlayer insulation film 139 and the second interlayer insulation film 123 by using a mask pattern (not shown). A single color organic light emitting layer 142 is formed on the cathode electrode 122 in the opening 141. An anode electrode 145 is formed on the electroluminescent layer 142, thereby finishing the fabrication of the active matrix organic light emitting diode device.

As discussed above, in accordance with an embodiment of the present invention, the organic light emitting diode device and the method for fabricating the same have the following advantages. The connection wiring contacts the lateral exposed surface of the source electrode of the first TFT and contacts top surface of the gate electrode of the second TFT through a single contact hole. Accordingly, the organic light emitting diode device and the method for fabricating the same can reduce the number of the contact holes and obtain a larger margin area as the design area of the driving transistor.

That is, the organic light emitting diode device and the method for fabricating the same can obtain a sufficient area for the driving transistor reducing the number of the contact holes. Accordingly, the lifespan of the driving transistor is less affected by the current stress. As a result, the lifespan of the organic light emitting diode device is extended.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalents of such metes and bounds are therefore intended to be embraced by the appended claims.

What is claimed is:

1. An organic light emitting diode device, comprising:
a first gate electrode of a first transistor on a substrate;
a second gate electrode of a second transistor on the substrate:
a gate insulation film on the first and second gate electrodes of the first and second transistors;
a first source electrode of the first transistor on the gate insulation film and overlapping with the second gate electrode of the second transistor;
a contact hole exposing the second gate electrode of the second transistor and the first source electrode of the first transistor, wherein the contact hole is formed within a region where the second gate electrode of the second transistor and the first source electrode of the first transistor are overlapped; and
a conductive wiring in the contact hole, for electrically connecting the first source electrode of the first transistor and the second gate electrode of the second transistor, thereby connecting the first transistor with the second transistor,
wherein the conductive wiring in the contact hole is in contact with a lateral surface of an inner of the second gate electrode of the second transistor and the first source electrode of the first transistor.

2. The organic light emitting diode device of claim 1, wherein the conductive wiring is in contact with the lateral surface of the first source electrode of the first transistor and the top surface of the second gate electrode of the second transistor.

3. The organic light emitting diode device of claim 1, further comprising a protection film above the gate insulation film and the source electrode, the contact hole passing through the protection film, the first source electrode of the first transistor at an area overlapping with the second gate electrode of the second transistor, and the gate insulation film, and exposing a lateral surface of the first source electrode of the first transistor and a top surface of the second gate electrode of the second transistor.

4. The organic light emitting diode device of claim 1, wherein the second gate electrode of the second transistor is a gate electrode of a driving transistor of the organic light emitting diode device.

5. The organic light emitting diode device of claim 1, wherein the first source electrode of the first transistor is a source electrode of a switching transistor of the organic light emitting diode device.

6. The organic light emitting diode device of claim 1, wherein a drain electrode of the first transistor is formed on the gate insulation film.

7. The organic light emitting diode device of claim 1, wherein the gate insulation film is located between the second gate electrode of the second transistor and the first source electrode of the first transistor.

8. An organic light emitting diode device, comprising:
a gate wiring, a first gate electrode of a first transistor, a second gate electrode of a second transistor and a capacitor lower electrode formed on a substrate;
a gate insulation film, a semiconductor layer, second source and drain electrodes of the second transistor, a data wiring and a capacitor upper electrode formed above the substrate and the capacitor lower electrode;
an interlayer insulation film formed on the whole substrate, and having a plurality of contact holes for exposing the second gate electrode of the second transistor, the source and drain electrodes of the first transistor, the capacitor lower electrode and the capacitor upper electrode, wherein one contact hole of the contact holes is formed within a region where the second gate electrode of the second transistor and the first source electrode of the first transistor are overlapped;
a plurality of conductive wirings formed on the interlayer insulation film, and respectively connected to the second gate electrode of the second transistor, the source and drain electrodes of the first transistor, the lower electrode and the upper electrode through the plurality of contact holes, one of the contact holes exposing the second gate electrode of the second transistor and one of the source and drain electrodes of the first transistor, one of the conductive wirings being located in the one of the contact holes to electrically connect the second gate electrode of the second transistor and the first source electrode of the first transistor, wherein the conductive wiring in the contact hole is in contact with a lateral surface of an inner of the second gate electrode of the second transistor and the first source electrode of the first transistor; and
an organic light emitting diode element formed on the interlayer insulation film, and connected to the connection wirings.

9. The organic light emitting diode device of claim 8, wherein the one of the conductive wirings is in contact with the lateral surface of the first source electrode of the first transistor and the top surface of the second gate electrode of the second transistor.

10. The organic light emitting diode of claim 8, wherein the first source electrode of the first transistor overlaps with the second gate electrode of the second transistor.

11. The organic light emitting diode device of claim 10, wherein the one of the contact holes passes through the interlayer insulation film, the first source electrode of the first transistor at an area overlapping with the second gate electrode of the second transistor, and the gate insulation film, and exposing a lateral surface of the first source electrode of the first transistor and a top surface of the second gate electrode of the second transistor.

12. The organic light emitting diode device of claim 8, wherein the second gate electrode of the second transistor is a gate electrode of a driving transistor of the organic light emitting diode device.

13. The organic light emitting diode device of claim 8, wherein the first source electrode of the first transistor is a source electrode of a switching transistor of the organic light emitting diode device.

14. A method for fabricating an organic light emitting diode device, comprising:
forming a first gate electrode of a first transistor and a second gate electrode of a second transistor on a substrate;
forming a gate insulation film on the first gate electrode of the first transistor and the second gate electrode of a second transistor;
forming a first source electrode of the first transistor on the gate insulation film such that the first source electrode of the first transistor are overlapped with the second gate electrode of the second transistor;
forming a contact hole exposing the second gate electrode of the second transistor and the first source electrode of the first transistor, wherein one contact hole of the contact holes is formed within a region where the second gate electrode of the second transistor and the first source electrode of the first transistor are overlapped; and
forming a conductive wiring in the contact hole such that the conductive wiring electrically connects the second gate electrode of the second transistor and the first source electrode of the first transistor,
wherein the conductive wiring in the contact hole is in contact with a lateral surface of an inner of the second gate electrode of the second transistor and the first source electrode of the first transistor.

15. The method of claim 14, wherein the step of forming the conductive wiring includes forming the conductive wiring in contact with the lateral surface of the first electrode of the first transistor and the top surface of the second gate electrode of the second transistor.

16. The method of claim 14, further comprising forming a protection film above the gate insulation film and the first source electrode, wherein the step of forming the contact hole includes forming the contact hole passing through the protection film, the first source electrode of the first transistor at an area overlapping with the second gate electrode of the second transistor, and the gate insulation film, and exposing a lateral surface of the first source electrode of the first transistor and a top surface of the second gate electrode of the second transistor.

17. The method of claim 14, wherein the second gate electrode of the second transistor is a gate electrode of a driving transistor of the organic light emitting diode device.

18. The method of claim 14, wherein the first source electrode of the first transistor is a source electrode of a switching transistor of the organic light emitting diode device.

19. The method of claim 14, further comprising a drain electrode of the first transistor on the gate insulation film.

20. The method of claim 14, wherein the step of forming the gate insulation film includes forming the gate insulation film between the second gate electrode of the second transistor and the first source electrode of the first transistor.

* * * * *